US009806679B2

(12) United States Patent
Gorbachov et al.

(10) Patent No.: US 9,806,679 B2
(45) Date of Patent: Oct. 31, 2017

(54) HIGH-LINEARITY CMOS WIFI RF POWER AMPLIFIERS IN WIDE RANGE OF BURST SIGNALS

(71) Applicant: SKYWORKS SOLUTIONS, INC., Woburn, MA (US)

(72) Inventors: Oleksandr Gorbachov, Irvine, CA (US); Qiang Li, Irvine, CA (US); Floyd Ashbaugh, Irvine, CA (US); Aydin Seyedi, Irvine, CA (US); Lothar Musiol, Irvine, CA (US); Lisette L. Zhang, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 14/849,936

(22) Filed: Sep. 10, 2015

(65) Prior Publication Data
US 2016/0072444 A1    Mar. 10, 2016

Related U.S. Application Data

(60) Provisional application No. 62/048,737, filed on Sep. 10, 2014.

(51) Int. Cl.
*H03F 3/04* (2006.01)
*H03F 3/193* (2006.01)
(Continued)

(52) U.S. Cl.
CPC .......... *H03F 3/193* (2013.01); *H03F 1/0261* (2013.01); *H03F 1/301* (2013.01); *H03F 1/3205* (2013.01);
(Continued)

(58) Field of Classification Search
CPC ....................................................... H03F 3/193
(Continued)

(56) References Cited

U.S. PATENT DOCUMENTS 7,443,246 B2    10/2008    Andrys et al.
7,532,066 B1    5/2009     Struble et al.
(Continued)

OTHER PUBLICATIONS

Gorbachov, Oleksandr; "RF Linear Power Amplifier Gain Stabilization Over Ambient Temperature"; Microwave Journal, Dec. 2005; Horizon House Publications, Inc.
(Continued)

*Primary Examiner* — Khanh V Nguyen
*Assistant Examiner* — Khiem Nguyen
(74) *Attorney, Agent, or Firm* — Stetina Brunda Garred & Brucker

(57) ABSTRACT

An RF power amplifier biasing circuit has a start ramp signal input, a main current source input, an auxiliary current source input, and a circuit output. A ramp-up capacitor is connected to the auxiliary current source input. A ramp-up switch transistor is connected to the start ramp signal input and is selectively thereby to connect the auxiliary current source input to the ramp-up capacitor. A buffer stage has an input connected to the ramp-up capacitor and an output connected to the main current source input at a sum node. A mirror transistor has a gate terminal corresponding to the circuit output and a source terminal connected to the sum node and to the gate terminal.

26 Claims, 7 Drawing Sheets

(51) Int. Cl.
H03F 1/30 (2006.01)
H03F 1/02 (2006.01)
H03F 1/32 (2006.01)
(52) U.S. Cl.
CPC .... *H03F 2200/18* (2013.01); *H03F 2200/451* (2013.01)
(58) Field of Classification Search
USPC .................. 330/296, 302–306, 285, 288, 261
See application file for complete search history.

(56) References Cited

U.S. PATENT DOCUMENTS

| | | | |
|---|---|---|---|
| 8,179,648 B1 * | 5/2012 | Loeb | H03F 1/52 330/281 |
| 8,260,224 B2 | 9/2012 | Doherty et al. | |
| 2009/0212863 A1 | 8/2009 | Ishimaru | |
| 2013/0034144 A1 | 2/2013 | Doherty et al. | |
| 2013/0127540 A1 | 5/2013 | Kim et al. | |
| 2013/0307625 A1 | 11/2013 | Hershberger et al. | |

OTHER PUBLICATIONS

Yoon, Sang-Woong; "Static and Dynamic Error Vector Magnitude Behavior of 2.4-GHz Power Amplifier"; IEEE Transactions on Microwave Theory and Techniques; vol. 55, No. 4, Apr. 2007.
Wei, Wei; Jensen, Ole Kiel; Mikkelsen, Jan H.; "Self-Heating and Memory Effects in RF Power Amplifiers Explained Through Electro-Thermal Modeling"; IEEE; 2013.
Samelis, Apostolos; Whittaker, Edward; Ball, Michael; Bruce, Alasdair; Nisbet, John; Lam, Lui; Vaillancourt, William; "Front-end Modules with Versatile Dynamic EVM Correction for 802.11 Applications in 2GHz Band"; Skyworks Solutions, Inc.; United Kingdom; IEEE; 2014.
Zhang, Yichi; Lin, Maoliu; "Evaluation of Envelope-Domain Dynamic X-Parameter Model Based on Variable-Carrier-Frequency Analysis"; Harbin Institute of Technology; China; IEEE, 2012.
Sadeghpour, T.; Karkhaneh, H.; Adb-Alhameed, R. A.; Ghorbani, A.; Noras, J. M.; Excell, P. S.; "Compensation of Transmission Non-Linearity Distortion with Memory Effect for a WLAN802.11a Transmitter"; IET Science Measurement and Technology; vol. 6; Issue 3; 2012.
Roblin, Patrick; Root, David E.; Verspecht, Jan; Ko, Youngseo; Teyssier, Jean Pierre; "New Trends for the Nonlinear Measurement and Modeling of High-Power RF Transistors and Amplifiers with Memory Effects"; IEEE Transactions on Microwave Theory and Techniques, vol. 60., No. 6, Jun. 2012.
Zhang, Yitao; Araki, Kiyomichi; "A Simple Envelope Model for Nonlinear Power Amplifiers with Memory Effects Based on Volterra Expansion"; Proceedings of Asia-Pacific Microwave Conference; 2010.
Ku, Hyunchul; Kenney, J. Stevenson; "Behavioral Modeling of Nonlinear RF Power Amplifiers Considering Memory Effects"; IEEE Transactions on Microwave Theory and Techniques; vol. 51; No. 12; Dec. 2003.
"Receive Signal Decoders" (online article); Aug. 3, 2004, [retrieved on Nov. 5, 2015]; [http://homepages.which.net/~paul.hills/Circuits/RxDecoder/RxDecoder.html].
Kundert, K.; "Power Supply Noise Reduction" (online guide); May 11, 2006, [retrieved on Nov. 5, 2015]; [http://www.designers-guide.orge/design/bypassing.pdf].
Delabs; "Non-Inverting Amplifier—Op-Amp Circuits" (blog posting); Mar. 12, 2014, [retrieved on Nov. 5, 2015]/ [http://schematics.dapj.com/2004/10/non-inverting-opamp.html].
PCT Search Report & Written Opinion for International Application No. PCT/US15/49501; Dec. 11, 2015.

* cited by examiner

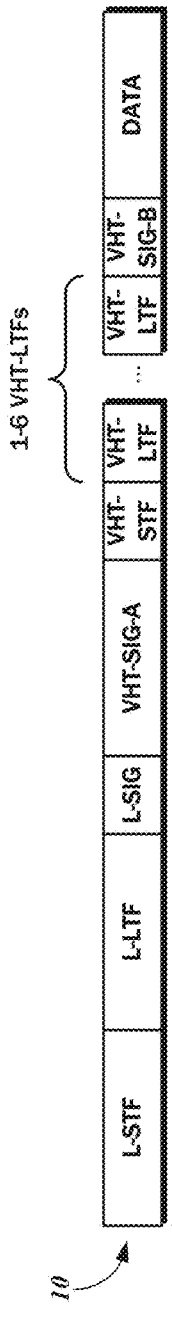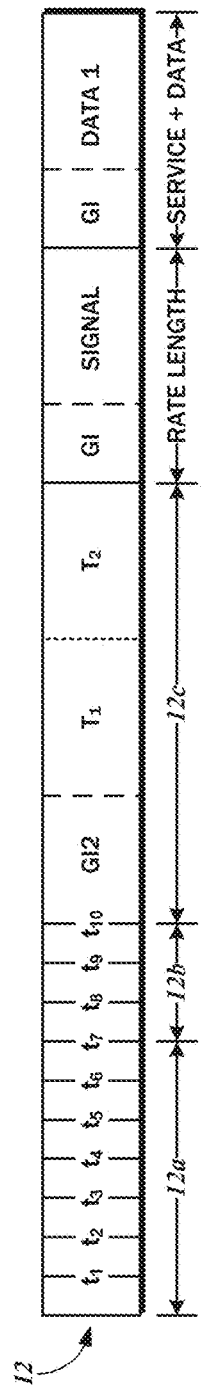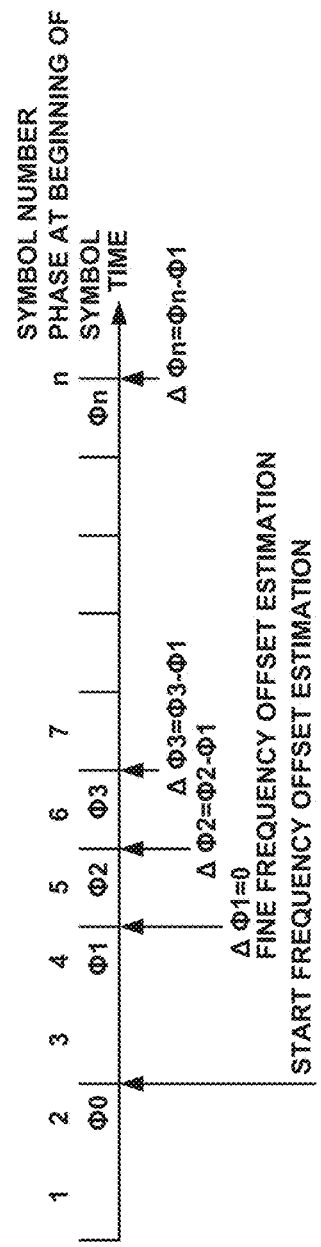
FIG. 1
FIG. 2
FIG. 3

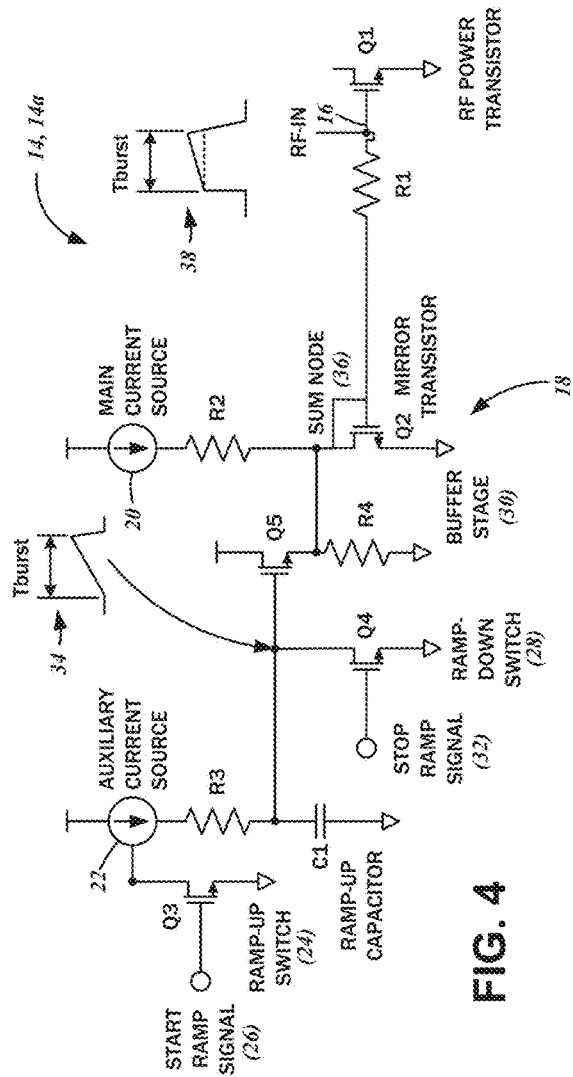
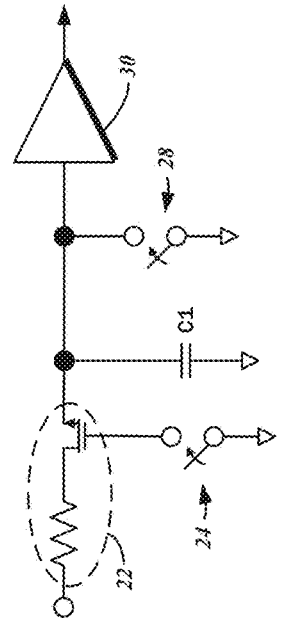
FIG. 4
FIG. 5

HIGH-LINEARITY CMOS WIFI RF POWER AMPLIFIERS IN WIDE RANGE OF BURST SIGNALS

CROSS-REFERENCE TO RELATED APPLICATIONS

This application relates to and claims the benefit of U.S. Provisional Application No. 62/048,737, filed Sep. 10, 2014 and entitled "HIGH-LINEARITY CMOS WIFI RF POWER AMPLIFIERS IN WIDE RANGE OF BURST SIGNALS" the entirety of the disclosure of which is wholly incorporated by reference herein.

STATEMENT RE: FEDERALLY SPONSORED RESEARCH/DEVELOPMENT

Not Applicable

BACKGROUND

1. Technical Field

The present disclosure relates generally to radio frequency (RF) integrated circuits, and more particularly, to complementary metal oxide semiconductor (CMOS) RF power amplifiers with high linearity across a wide range of burst signals in WiFi applications.

2. Related Art

Wireless communications systems are utilized in a variety of contexts involving information transfer over long and short distances alike, and a wide range of modalities for addressing the particular needs of each being known in the art. As a general matter, wireless communications involve an RF carrier signal that is variously modulated to represent information/data, and the encoding, modulation, transmission, reception, de-modulation, and decoding of the signal conform to a set of standards for coordination of the same.

In the local area data networking context, WLAN or Wireless LAN, also commonly referred to as WiFi as well as 802.11 (referring to the governing IEEE standard), is the most widely deployed. The later, more advanced WiFi standards such as 802.11ac, and the previous 802.11n and 802.11a standards on which it was based specify an orthogonal frequency division multiplexing system where equally spaced subcarriers at different frequencies are used to transmit data. Several computer systems or network nodes within a local area can connect to an access point, which in turn may provide a link to other networks and the greater global Internet network. Computing devices of all form factors, from mobile phones, tablets, and personal computers now have WiFi connectivity, and WiFi networks may be found everywhere.

As is fundamental to any wireless communications systems, a WiFi network interface device includes a transceiver, that is, a combined transmitter and receiver circuitry. The transceiver, with its digital baseband system, encodes the digital data to an analog baseband signal, and modulates the baseband signal with an RF carrier signal. Upon receipt, the transceiver down-converts the RF signal, demodulates the baseband signal, and decodes the digital data represented by the baseband signal. An antenna connected to the transceiver converts the electrical signal to electromagnetic waves, and vice versa. In most cases, the transceiver circuitry itself does not generate sufficient power or have sufficient sensitivity necessary for communications. Thus, additional circuits are referred to as a front end is utilized between the transceiver and the antenna. The front end includes a power amplifier for boosting transmission power, and/or a low noise amplifier to increase reception sensitivity.

RF power amplifiers utilized in WiFi systems ideally have linear performance, which is described in terms of the error vector magnitude (EVM) of the transmitted signal. In order to conserve energy, the power amplifier is turned on and off in accordance with the transmit signal burst applied to its input. However, such switching generates transient current, voltage, power gain, phase, and so on. In particular, the edges of ramping signals results in a deterioration of EVM, also referred to as dynamic EVM, which is understood to differ from static EVM, where the control signal applied to the power amplifier is in a continuously on state. In addition to the transient signals attributable to the dynamically switching currents and voltages, thermal properties of the transistors in the power amplifier circuitry also contribute to transient signals.

In the publication "Static and Dynamic Error Vector Magnitude Behavior of 2.4-GHz Power Amplifier", Sang-Woong Yoon, IEEE Transactions on Microwave Theory and Techniques, Vol. 55, No. 4, April 2007, a thermal effects influence on dynamic EVM was presented, and compared to static EVM. The explanation was limited, however, to the output power level change during burst, which is understood to be equivalent to gain change. Conventional communications systems can readily demodulate signals with the small power level variations described. While the root cause of thermal heating affecting dynamic EVM was explored, only a partial explanation was proposed. Subsequently, in the publication "Self-heating and Memory Effects in RF Power Amplifiers Explained Through Electro-Thermal Modeling", Wei Wei, et al., in NORCHIP 2013, November 2013, it was discovered that there are both amplitude-amplitude (AM-AM) and amplitude-phase (AM-PM) distortions that may be found in the modulated signal as a result of thermal effects. These distortions were found to influence the level and phase of the inter-modulation products. According to the described simulation, even below a 50 kHz two-tone spacing, there was no difference in left- and right-side products of intermodulation distortion. In actual implementation, envelope variations may be at a rate of several megahertz or tens of megahertz. Such fast variation of frequency is not understood to cause a fast and large variation of power amplifier transistor temperatures within the semiconductor die. In WiFi systems utilizing conventional gallium arsenide (GaAs) or silicon technologies, the thermal time constant for power amplifier transistor stages can range from several microseconds to several tens of microseconds.

A technique for compensating for power amplifier transients at the beginning of the transmission burst is disclosed in U.S. Pat. No. 8,260,224 to Doherty et al. This technique is understood to require a pulsed "pre-heating" by a high current for over hundreds of microseconds before the RF signal burst with consecutive current shaping. Such "pre-heating" is understood to be impractical for WiFi signals, as incoming RF signal bursts are dependent on multiple factors according to the network protocol. Problematically, the delay of the RF transmit signal is understood to result in a substantial reduction in data throughput. Furthermore, an additional control input/timing is needed, and though this is typically lacking in existing WiFi platform solutions.

U.S. Pat. App. Pub. No. 2013/0307625 to Hershberger et al. disclosed a bias boost circuit that is applied to the base of the RF transistor in the WiFi power amplifier. A constant bias is applied during the RF signal burst, in addition to an exponentially decaying boost current that is applied at the beginning of the burst to compensate for RF transients. Although this technique may be suitable for power amplifiers implemented with bipolar transistors, in CMOS-based power amplifiers, a high level of transients may be generated, and degrade dynamic EVM further.

U.S. Pat. App. Pub. No. 2013/0127540 to Kim et al. disclosed a power amplifier with phase compensation circuitry. Specifically, phase compensation over the RF signal power level with a pre-distortion for linear power amplifiers is disclosed, but is not understood to be useful for minimizing dynamic EVM variations at signal burst edges.

A transient compensation circuit particular to WiFi power amplifiers is disclosed in U.S. Pat. No. 7,532,066 to Struble, et al. A current steering circuit is used to add current at the beginning of an RF signal burst along the same lines as Hershberger. However, dynamic degradation is not considered, and the solution appears limited to power level dependence.

In a publication entitled "Front-end Modules with Versatile Dynamic EVM Correction for 802.11 Applications in the 2 GHz Band", Samelis, et al., 2014 IEEE Topical Conference on Power Amplifiers for Wireless and Radio Applications (PAWR), January 2014, test results of a dynamic EVM compensation circuit implemented with silicon-germanium (SiGe) heterojunction bipolar transistor (HBT) power amplifiers for a WiFi front end circuit are disclosed. Thermal dependence was indicated as the root cause of dynamic EVM for different burst conditions, but only fairly short burst windows of approximately 176 microseconds were considered, which are typical for mobile applications. In the proposed circuit, digital settings would be needed during preliminary calibration at different power levels. Furthermore, the proposed circuit is understood to be unsuitable for increased bias voltages that are typical of more recent modulation schemes such as those specified in the 802.11ac standard.

Along these lines, recent WiFi systems implementing 802.11n and/or 802.11ac may employ a wider burst of up to several milliseconds to transmit a larger amount of data as would be typical in access point or router operation. The more substantial thermal issues along with higher transmit power levels complicate dynamic EVM compensation circuits. While suitable for such high power applications, GaAs semiconductor material has approximately three times the thermal resistance of silicon material, so circuits fabricated therewith are understood to be more prone to transients and dynamic EVM deterioration at different burst conditions.

Accordingly, there is a need in the art to address the problem of dynamic EVM over the entire burst duration. That is, there is a need in the art for RF power amplifiers with high linearity across a wide range of burst signals in WiFi applications.

BRIEF SUMMARY

The present disclosure is directed to solving dynamic EVM issues in WiFi RF power amplifiers by adjusting gain and phase properties over the duration of an entire signal transmission burst. Generally, the gain and phase properties may be compensated via appropriate adjustment of the biasing voltage to the power amplifier over the burst duration. Furthermore, various embodiments contemplate the adjustment of biasing voltages over a wide range of ambient temperatures to further minimize dynamic EVM.

According to one embodiment of the present disclosure, there is a radio frequency (RF) power amplifier circuit that is comprised of a power amplifier and a control circuit. The power amplifier may include a power amplifier output and an RF signal input. The control circuit may selectively bias the power amplifier, and may include an auxiliary current source and a ramp-up capacitor connected to the auxiliary current source. Furthermore, the control circuit may include a ramp-up switch that is connected to the auxiliary current source. The ramp up switch may selectively activate the auxiliary current source and charge the ramp-up capacitor in response to a control signal corresponding to an RF signal burst. The control circuit may also include a buffer with an output and an input connected to the ramp-up capacitor. Voltage at the input of the buffer may be linearly dependent over an RF signal burst duration. There may also be a main current source that can be connected to the output of the buffer at a sum node. The sum node, in turn, may be connected to the power amplifier.

Another embodiment of the present disclosure is directed to an RF power amplifier biasing circuit with a start ramp signal input, a main current source input, an auxiliary current source input, and a circuit output. There may be a ramp-up capacitor connected to the auxiliary current source input. The biasing circuit may also include a ramp-up switch transistor that is connected to the start ramp signal input. The ramp-up switch transistor may be selectively activated by the start ramp signal input to connect the auxiliary current source input to the ramp-up capacitor. There may also be a buffer stage with an input connected to the ramp-up capacitor and an output connected to the main current source input at a sum node. Furthermore, the biasing circuit may include a mirror transistor with a gate terminal corresponding to the circuit output and a source terminal connected to the sum node and to the gate terminal.

In one variation, there may be a ramp-down switch transistor that is activated at the end of the RF signal transmission burst to discharge the ramp-up capacitor. In another variation, there may be an inverter stage with an input connected to the ramp-up capacitor and an output connected to the buffer stage, with the ramp-up switch being driven by a pulse that is shorter in duration that the RF signal transmission burst.

Yet another embodiment of the present disclosure is an RF power amplifier biasing circuit with a biasing output and is connectable to a band gap reference circuit with a first current output generating a first voltage level and a second current output generating a second voltage level. The circuit may include a switch having a first throw terminal, a second throw terminal, and a pole terminal. The first throw terminal may be connected to the first current output of the band gap reference circuit, and the second throw terminal may be connected to the second current output of the band gap reference circuit. The switch may selectively connect the first throw terminal and the second throw terminal to the pole terminal in response to a switch enable input. There may also be an operational amplifier with a first differential input, a second differential input, and an operational amplifier output. The operational amplifier may also be powered by the band gap reference circuit. The biasing circuit may also include a ramping resistor-capacitor network connected to the first differential input of the operational amplifier. A ramping resistor of the ramping resistor-capacitor network may be connected to the pole terminal of the switch. The biasing circuit may have an output transistor that is connected to the output of the operational amplifier. Further, it may define an output that corresponds to the biasing output. A feedback resistor network may be connected to the output transistor and to the second differential input of the operational amplifier. A voltage on the biasing output may ramp from the first voltage level to the second voltage level in conjunction with the switch being selectively activated from connecting the first throw terminal and the pole terminal, to connecting the second throw terminal and the pole terminal.

The various embodiments of the present disclosure will be best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings, in which like numbers refer to like parts throughout, and in which:

FIG. 1 is a diagram illustrating a Physical Layer Convergence Protocol (PLCP) data unit for the IEEE 802.11 wireless LAN standard;

FIG. 2 is a diagram illustrating an Orthogonal Frequency Division Multiplexing (OFDM) training sequence structure/PLCP preamble;

FIG. 3 is a diagram illustrating frequency offset estimation over multiple symbols and resulting phase errors that contribute to total error vector magnitude (EVM) over a packet burst;

FIG. 4 is a schematic diagram of a first embodiment of an RF power amplifier bias control circuit;

FIG. 5 is a simplified schematic diagram of the bias control circuit shown in FIG. 4;

DETAILED DESCRIPTION

Figure 6:
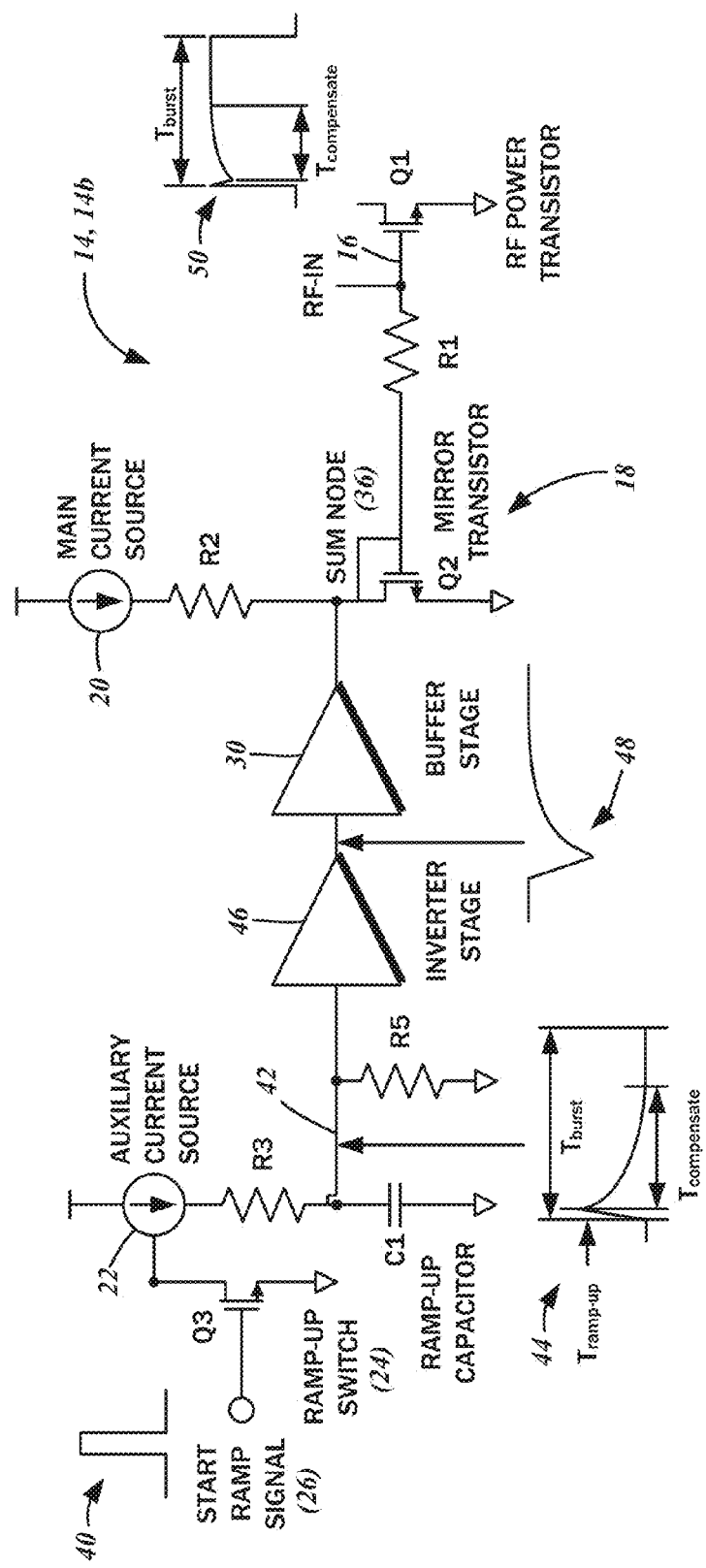
FIG. 6 is a schematic diagram of a second embodiment of the RF power amplifier bias control circuit.

The present disclosure is directed to RF power amplifier circuits that have high linearity with minimal dynamic error vector magnitude (EVM) across a wide range of WiFi burst signal lengths. The gain and phase of the RF power amplifier is adjusted over the entire burst duration and over a wide range of ambient temperatures by compensating with biasing voltages to one or more of the RF power amplifier stages.

The detailed description set forth below in connection with the appended drawings is intended as a description of the several presently contemplated embodiments of power amplifier circuits and a bias control circuits, and is not intended to represent the only form in which the disclosed invention may be developed or utilized. The description sets forth the functions and features in connection with the illustrated embodiments. It is to be understood, however, that the same or equivalent functions may be accomplished by different embodiments that are also intended to be encompassed within the scope of the present disclosure. It is further understood that the use of relational terms such as first and second and the like are used solely to distinguish one from another entity without necessarily requiring or implying any actual such relationship or order between such entities.

The diagram of FIG. 1 illustrates a Physical Layer Convergence Protocol (PLCP) Data Unit (PPDU 10), which is understood to represent a basic physical layer transmission frame as defined under the IEEE 802.11 standard. As indicated above, more recent WiFi standards such as 802.11ac, as well as the earlier 802.11a and 802.11n standards from which 802.11ac is based utilize orthogonal frequency division multiplexing, where data is transmitted in equally spaced subcarriers. The number of subcarriers largely depends on the bandwidth, and can vary from 64 subcarriers for a 20 MHz bandwidth, up to 512 subcarriers for a 160 MHz bandwidth. Very High Throughput (VHT) devices are required to co-exist with legacy devices operating under the earlier 802.11a and 802.11n standards. Accordingly, VHT devices send the same preamble in each 20 MHz sub-band so that all 802.11 devices may synchronize with the packet.

In further detail, the mixed format PPDU 10 includes a legacy short training field (L-STF) of 2 symbols, and a legacy long training field (L-LTF) also of 2 symbols. These are used for backwards compatibility with previous standards, and are duplicated for each 20 MHz sub-band with phase rotation to mitigate the effects of Peak to Average Power Ratio (PAPR) that otherwise reduce the efficiency of the RF power amplifiers. These training fields are followed by a legacy signal field (L-SIG) of 1 symbol, transmitted by binary phase shift keying (BPSK).

Fields specific to VHT transmissions are also part of the 802.11ac PPDU 10, including a VHT-SIG-A field of 2 symbols that communicate how the receiver is to interpret subsequent packets and specify bandwidth, number of MIMO streams, space-time block codes used, guard interval, and so forth. Additionally, there is a VHT short training field (VHT-STF) of 1 symbol used to improve gain control estimation for MIMO operation, and a variable number (1, 2, 4, 6, or 8) VHT long training fields (VHT-LTF) of 1 symbol each. There is a VHT-SIG-B field that details payload data, including data length and modulation coding scheme for multi-user mode. Following these fields is a data field.

Referring now to the diagram of FIG. 2, an OFDM training sequence structure 12 includes $t_1$ to $t_{10}$ short training symbols and $T_1$ and $T_2$ long training symbols that is separated by a guard interval GI2. A first set 12a of training symbols is used for signal detection, automatic gain control, and diversity selection, while a second set 12b of training symbols is used for coarse frequency offset estimation and timing synchronization at a receiver node. Each of the symbols is 16 samples long, or 0.8 μs. The long training symbols within a third set 12c are used for fine frequency offset estimation, and for channel coefficients estimation. The long training symbols are followed by a SIGNAL and a DATA field, each separated by guard intervals GI.

Phase tracking is a central requirement for WiFi implementations, as OFDM consists of multiple sub-carriers with amplitude and phase modulation such as BPSK, QPSK, and QAM in each sub-carrier. Referring now to the diagram of FIG. 3, coarse frequency offset estimation is used by the demodulator at the second symbol to set the PLL (phase locked loop) frequency in a receive chain. It is understood that frequency detectors are based on phase detection of a signal. Fine frequency offset estimation in the demodulator sets the precise frequency of the PLL by the end of the fourth symbol, and the reference phase is set to ΔΦ=0. Each consecutive symbol is compared to ΔΦ=0, so each consecutive symbol is understood to have a phase error ΔΦn referenced to the phase Φ1, at which point the frequency offset is established in the PLL. The sum of these errors is understood to create a total EVM over the packet burst, along with other amplitude errors that may be present in the transmit chain. This technique is referred to in the art as preamble tracking, and is understood to be advantageous as requiring minimal processor resources, and reduced current consumption of the WiFi system over payload tracking techniques.

Various embodiments of the present disclosure are directed to minimizing dynamic EVM in preamble tracking WiFi systems. Referring to the schematic diagram of FIG. 4, a first embodiment of a bias control circuit 14a is shown connected to an RF power amplifier stage as represented by a transistor Q1. In this regard, the bias control circuit 14a is understood to have a bias control output 16, with the gate of the transistor Q1 corresponding to the RF power amplifier input, to which an RF signal input is also connected.

The RF power amplifier, e.g., the transistor Q1, is biased by a current mirror circuit 18 that includes a mirror transistor Q2, the gate and drain terminals of which are connected to the input of the RF power amplifier and specifically the gate terminal of the transistor Q1. There is a resistor R1 interconnecting the respective gate terminals of the transistors Q1 and Q2, and is understood to decouple the RF signal input from the bias control circuit 14. Accordingly, the resistor R1 has a large value. The mirror transistor Q2 is biased via a main current source 20, which is connected to a drain of the mirror transistor Q2 in series with a resistor R2. The main current source 20 is understood to generate a constant current during an RF signal transmission burst.

In addition to the main current source 20, various embodiments of the bias control circuit 14 are understood to incorporate an auxiliary current source 22. Like the main current source 20, the auxiliary current source 22 outputs a constant current when turned on. The bias control circuit 14 further includes a ramp-up switch 24, that is, a transistor Q3 that selectively activates the auxiliary current source 22. By way of a start ramp signal 26, generally referred to as a control signal, the transistor Q3 is turned on and turned off. The start ramp signal 26 is understood to transition to an on or high state in conjunction with the RF signal transmission burst, and specifically to the start of the same. With the transistor Q3 turned on, the DC current from the auxiliary current source 22, through resistor R3, begins charging a ramp-up capacitor C1.

Thus, as illustrated by FIG. 5, the output of the auxiliary current source 22 as controlled by the ramp-up switch 24 is connected to the ramp-up capacitor C1, a ramp-down switch 28, as well as a buffer stage 30. The ramp-down switch 28 corresponds to a transistor Q4, which may be selectively activated by a stop ramp signal 32. Generally, when the start ramp signal 26 is active, the stop ramp signal is inactive, and the transistor Q4 is off.

In further detail, the buffer stage 30 may be implemented as a source follower (common drain stage) based on a transistor Q5, with a gate terminal thereof corresponding to an input, and a source terminal thereof corresponding to an output. The voltage at the input of the buffer stage 30, e.g., the gate terminal of the transistor Q5, is understood to have a linear dependence over the duration of the RF signal transmission burst, as shown in plot 34. This voltage is added to the voltage from the main current source 20 at a sum node 36, which is connected to the source terminal of the transistor Q5, as well as the drain and gate terminals of the mirror transistor Q2 (sum node). The constant DC voltage from the main current source 20, together within the ramping voltage from the auxiliary current source 22, results in a bias signal as represented in a plot 38 with duration of $T_{burst}$. In accordance with various embodiments, the slope of the linearly increasing voltage, together with the voltage provided by the main current source 20 at the sum node 36 is understood to compensate for S21 (gain) and S21 phase characteristics over the entirety of the RF signal transmission burst. Accordingly, minimization of overall dynamic EVM can be achieved.

At the end of the RF signal transmission burst, the start ramp signal 26 is deactivated or turned off, thus disconnecting the auxiliary current source 22. Furthermore, the stop ramp signal 32 is activated or turned on, thereby activating the ramp-down switch 28, e.g., the transistor Q4. The remaining voltage stored in the ramp-up capacitor C1 is understood to be discharged through the small resistance of the transistor Q4, as it provides a current path to ground.

A second embodiment of a bias control circuit 14b is shown in the schematic diagram of FIG. 6. Again, the bias control circuit 14 is connected to an RF power amplifier stage as represented by the transistor Q1, and thus defining the bias control output 16. The gate of the transistor Q1 corresponds to the RF power amplifier input, to which the RF signal input is connected.

Like the first embodiment 14a, the RF power amplifier, e.g., the transistor Q1, is biased by the current mirror circuit 18 that includes the mirror transistor Q2, the gate and drain terminals of which are connected to the input of the RF power amplifier and specifically to the gate terminal of the transistor Q1. The resistor R1 interconnects the respective gate terminals of the transistors Q1 and Q2, and decouples the RF signal input from the bias control circuit 14. The mirror transistor Q2 is biased via the main current source 20, which is connected to the drain of the mirror transistor Q2 in series with a resistor R2. The main current source 20 generates a constant current during an RF signal transmission burst.

The second embodiment of the bias control circuit 14b also incorporates the auxiliary current source 22 that outputs a constant current when turned on. Again, the ramp-up switch 24 (transistor Q3) selectively activates the auxiliary current source 22. With the start ramp signal 26, generally referred to as a control signal, the transistor Q3 is turned on and turned off. In the second embodiment, the start ramp signal 26 is a pulse as shown in plot 40, and is initiated at the beginning of the RF signal transmission burst. While the transistor Q3 turned on, the DC current from the auxiliary current source 22, through resistor R3, charges the ramp-up capacitor C1 to a specified voltage level. As the duration of the pulse of the start ramp signal 26 is short, so is the charging time. It is understood to be less than a signal symbol duration, and is only several nanoseconds long.

Once the start ramp signal 26 returns to zero, the ramp-up capacitor C1 is discharging through resistor R5, which is also connected to the output of the auxiliary current source 22 as well as the ramp-up capacitor C1. Thus, at node 42 (to which the ramp-up capacitor C1, resistor R5, and the auxiliary current source 22 are connected) there is an exponentially decaying voltage in a time frame that is less than the minimum burst width of the RF signal transmission. According to various embodiments, this duration is understood to be several tens of microseconds. An example plot 44 shows the initial fast ramp-up charging, followed by the gradual discharging, of the ramp-up capacitor C1.

The second embodiment of the bias control circuit 14b incorporates an inverter stage 46, an input to which is connected to the node 42, e.g., the ramp-up capacitor C1, the output of the auxiliary current source 22, and the resistor R5. The inverter stage 46 inverts the voltage signal at its input as shown in a plot 48, where there is an immediate drop in voltage followed by an increase for an extended duration. This voltage is input to the buffer stage 30, where it is combined with the constant voltage signal output by the main current source 20 at the sum node 36. A plot 50 illustrates the exemplary bias control voltage signal that is in accordance with this combination.

It is expressly contemplated that the slope of the exponentially increasing voltage may be adjusted by changing the ramp-up capacitor C1 and/or the resistor R5 values. Furthermore, the initial voltage level to which the ramp-up capacitor C1 is charged, as well as the voltage provided by the main current source 20 at the sum node 36 results in compensating for gain and phase characteristics over the entirety of the RF signal transmission burst. As such, overall dynamic EVM can be minimized. The ramp-up time is selected so that dynamic EVM is not degraded by a short spike in the DC voltage at the beginning of the RF signal transmission burst. Although in the contemplated embodiment the EVM of the first few transmitted symbols are distorted, because the phase of consecutive symbols are compared to the compensated phase during the fine frequency offset estimation, overall EVM during the RF signal transmission burst is understood to be minimized.

Figure 7:
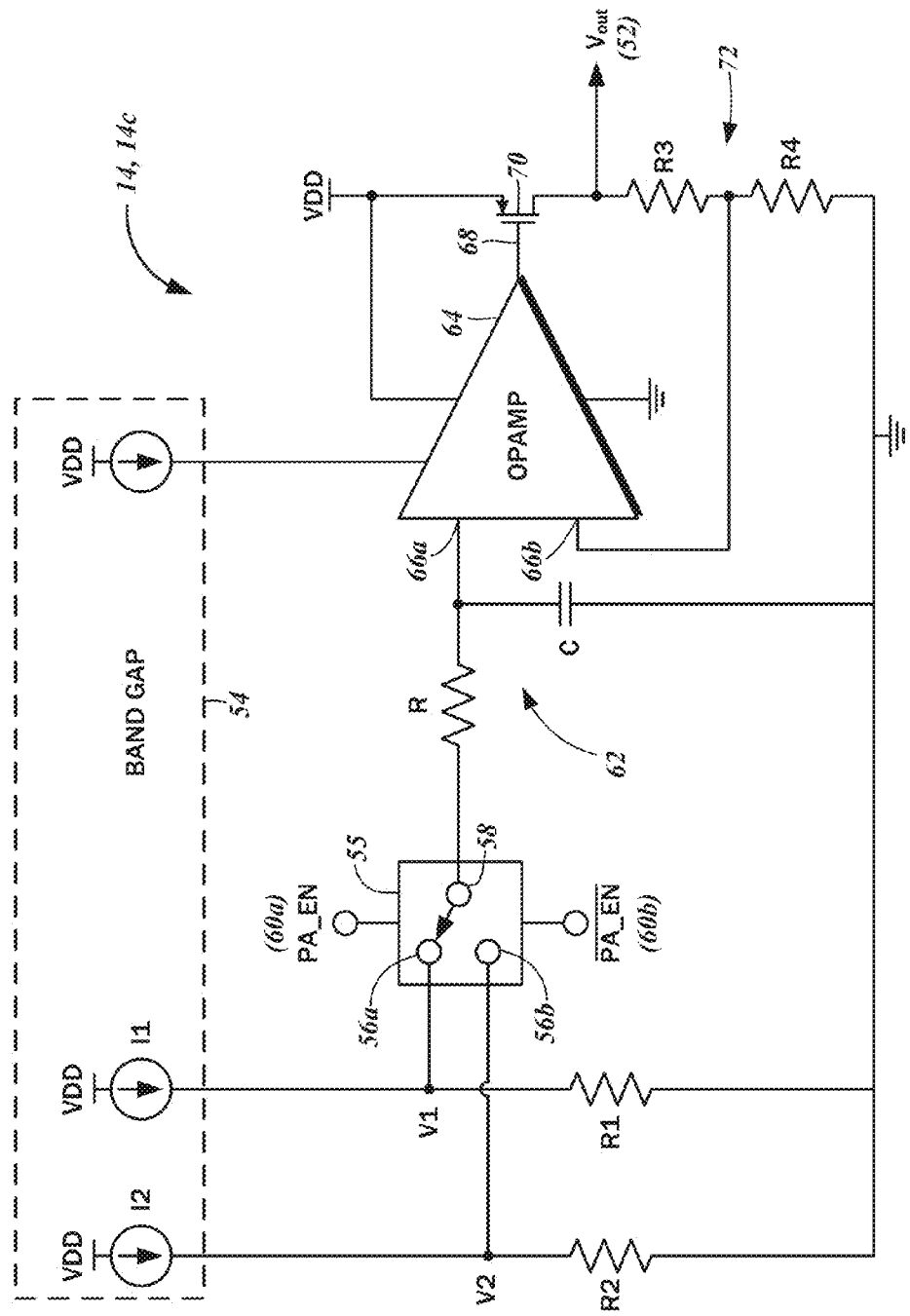
FIG. 7 is a schematic diagram of a third embodiment of the RF power amplifier bias control circuit.

Referring now to the schematic diagram of FIG. 7, there is a further third embodiment of the bias control circuit 14c, an output 52 of which can similarly be connected to various RF power amplifiers as bias current sources. The bias control circuit 14c may be connected to a band gap reference circuit 54 that provides a stable current at three output nodes. The first current output i1 is connected to a resistor R1 tied to ground, and the second current output i2 is connected to a resistor R2 also tied to ground. Accordingly, resistors R1 and R2, together with the first and second current outputs i1 and i2, respectively, define V1 and V2 as reference voltages.

The bias control circuit 14c also includes a switch 55 with a first throw terminal 56a that is tied to the reference voltage V1, and a second throw terminal 55b that is tied to the reference voltage V2. The switch 55 further includes a pole terminal 58 that is selectively connected to one of the first and second throw terminals 56a, 55b depending on the enable line input 60a and/or the inverse enable line input 60b. The pole terminal 58 is connected to a ramping R-C network 62 defined by a resistor R and a capacitor C. According to various embodiments, the ramping R-C network 62 sets the time constant for ramping from the reference voltages V1 to V2 in order to compensate for dynamic EVM impairments in RF transmission bursts of varying durations.

There is an operational amplifier 64 with a first differential input 66a, a second differential input 65b, and an operational amplifier output 68. The band gap reference circuit 54 also provides a stable current to the operational amplifier 64.

The ramping R-C network 62 is connected to the first differential input 66a, while the operational amplifier output 68 is fed back to the second differential input 65b. Specifically, the operational amplifier output 68 is connected to the gate of an output transistor 70, which is preferably, though optionally a PMOS type. The drain terminal of the output transistor 70 is connected to a feedback network 72 comprised of a resistive divider formed by resistor R3 and R4. The junction between the resistor R3 and R4 is connected to the second differential input 65b. Furthermore, the drain terminal of the output transistor 70 is understood to correspond to the output 52. The voltage level at the output 52 is set by the feedback network 72, the output transistor 70, and the operational amplifier 64.

As indicated above, the output 52 is connected to an RF power amplifier transistor stage, and with further particularity, the drain terminal of such a transistor. In a multi-stage power amplifier, the output 52 of the bias control circuit 14c may be connected to the first stage that consume the lowest amount of current, but it is also contemplated that the output 52 may be connected to any other stage, and not limited to the final stage.

Figure 8A:
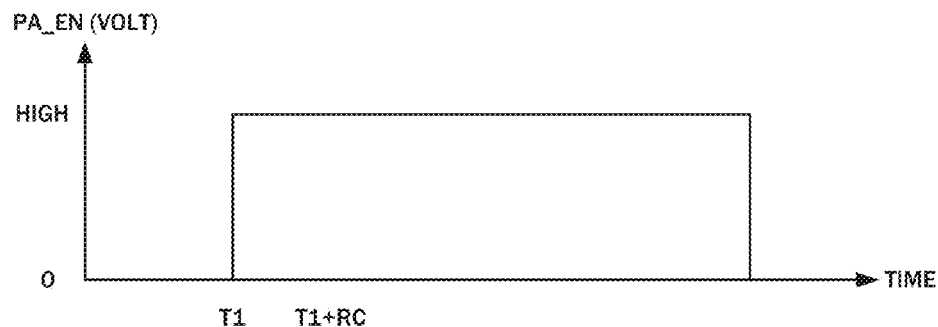
FIGS. 8A, 8B, 8C are ideal timing diagrams of the enable line used in the third embodiment of the RF power amplifier bias control circuit shown in FIG. 7.
Figure 8B:
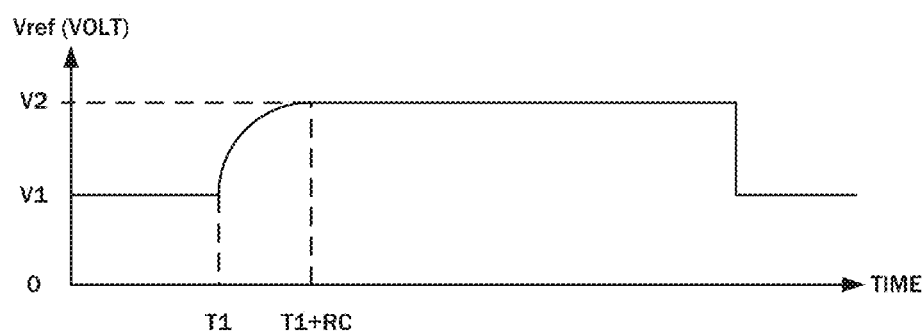
Figure 8C:
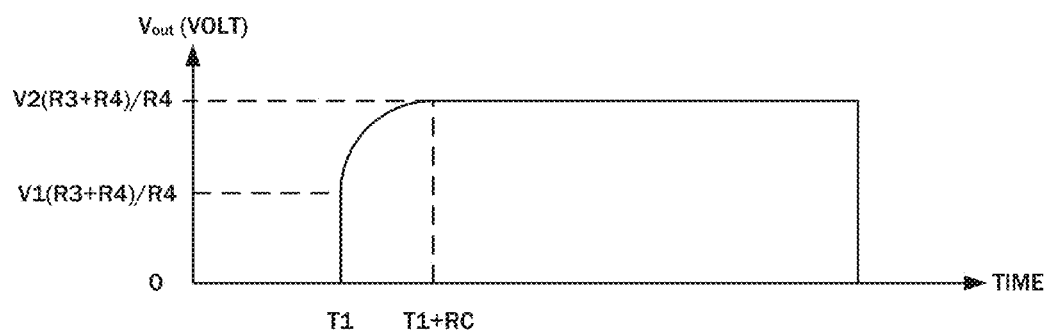

Referring to the graphs of FIGS. 8A-8C, various timing diagrams showing the enable line input 60, the resulting reference voltage $V_{ref}$ during the same duration, and the output voltage from the output 52 will be considered. In particular, FIG. 8A plots the enable line input 60 going to "high" at a time T1, and remaining high for the duration of the RF transmission burst. FIG. 8B shows the reference voltage input to the operational amplifier 64 initially starting at voltage level V1 until time T1 when the enable line input 60 transitions to "high," with the reference voltage input transitioning to the voltage level V2 from time T1 to time T1 plus the RC time constant. Once the enable line input 60 is transitioned back to zero, the reference voltage input transitions to voltage level V1. Finally, the plot of FIG. 8C shows the output voltage at the output 52, which is defined as V1(R3+R4)/R4 or V2(R3+R4)/R4. Thus, when the enable line input 60 is low, the output voltage is a function of reference voltage V1 and the feedback network 72, whereas when the enable line input 60 is high, the output voltage is a function of reference voltage V2 and the feedback network 72.

Although the various components, including the resistor R and the capacitor C of the ramping R-C network 62, and the resistors R3 and R4 of the feedback network 72, are depicted as single components, it will be appreciated by those having ordinary skill in the art that multiple ones can be combined to define such components. Furthermore, having considered the configuration and arrangement of the bias control circuits 14, the specific values of the components to achieve the contemplated dynamic EVM minimization objectives will be within the purview of one having ordinary skill in the art.

Figure 9:
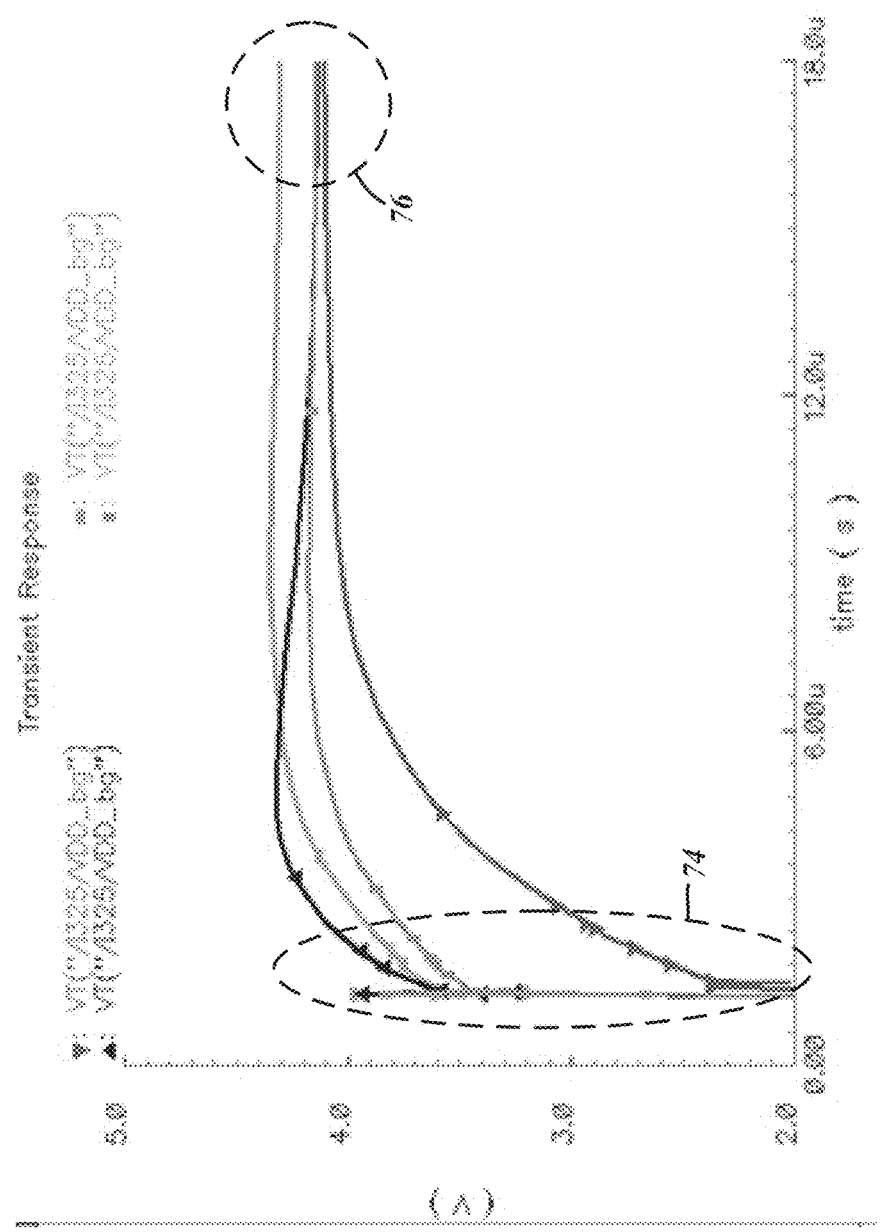
FIG. 9 is a graph plotting simulated transient characteristics of the third embodiment of the RF power amplifier bias control circuit shown in FIG. 7.

The graph of FIG. 9 plots the simulated transient responses of the bias control circuit 14c over time. A first region 74 is of the output initial voltage level, while a second region 76 is of the output final voltage level for different component values.

Figure 10:
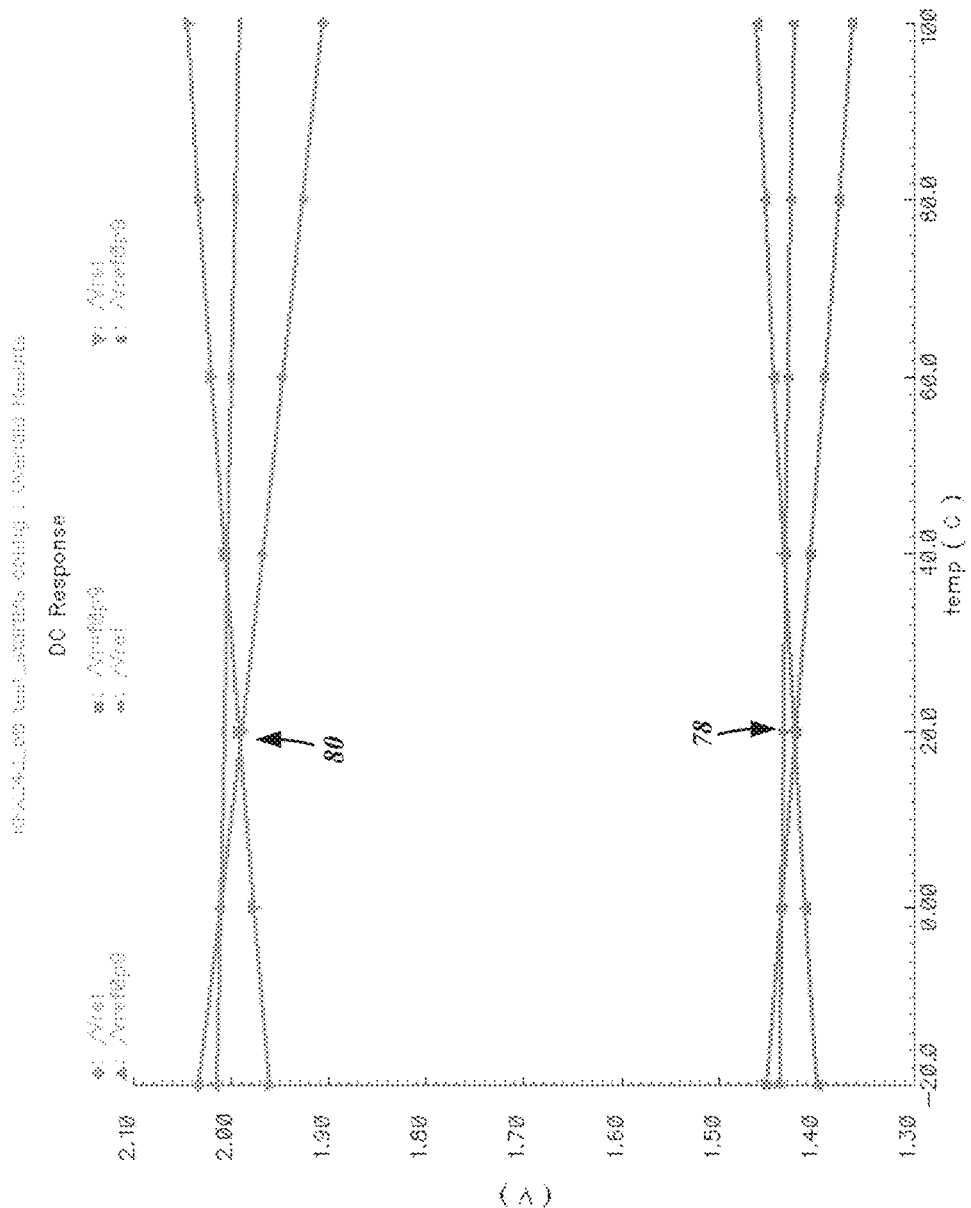
FIG. 10 is a graph plotting compensation characteristics over a range of ambient temperatures in temperature-compensated reference voltages generated for the bias control circuit in accordance with various embodiments of the present disclosure.

In accordance with various embodiments of the present disclosure, the reference voltages V1 and V2 can be adjusted for different ambient and transistor junction temperatures, as the phase and amplitude characteristics of the RF power amplifier may depend thereon. The graph of FIG. 10 shows the compensation characteristics over an ambient temperature range, with a first set of plots 78 showing the output initial voltage levels with positive, negative, and constant temperature profiles, and a second set of plots 80 showing the output final voltage levels with positive, negative, and constant temperature profiles. In this regard, the bias control circuit 14 may include ambient temperature voltage adjustment circuits that are connectable to the band gap reference circuit 54.

It is contemplated that the bias control circuits 14 of the present disclosure may be utilized in other digitally modulated wireless communications modalities, as well as for different semiconductor technologies to compensate for dynamic EVM that are a consequence of dynamic switching of RF transistor stages.

The particulars shown herein are by way of example and for purposes of illustrative discussion of the embodiments of the power amplifier only and are presented in the cause of providing what is believed to be the most useful and readily understood description of the principles and conceptual aspects. In this regard, no attempt is made to show details with more particularity than is necessary, the description taken with the drawings making apparent to those skilled in the art how the several forms of the present disclosure may be embodied in practice.

What is claimed is:

1. A radio frequency (RF) power amplifier circuit, comprising:
   a power amplifier including a power amplifier output and an RF signal input;
   a control circuit selectively biasing the power amplifier, the control circuit including:
      an auxiliary current source;
      a ramp-up capacitor connected to the auxiliary current source;
      a ramp-up switch connected to the auxiliary current source, the ramp up switch selectively activating the auxiliary current source and charging the ramp-up capacitor in response to a control signal corresponding to an RF signal burst;
      a buffer including an output and an input connected to the ramp-up capacitor, voltage at the input of the buffer being linearly dependent over an RF signal burst duration; and
      a main current source connected to the output of the buffer at a sum node connected to the power amplifier, the main current source generating a constant current during the RF signal burst.

2. The RF power amplifier circuit of claim 1 further comprising:
   an RF decoupling resistor; and
   a mirror transistor biased by the main current source and connected to the power amplifier, the power amplifier including a power amplifier transistor connected to the mirror transistor over the RF decoupling resistor.

3. The RF power amplifier circuit of claim 2 wherein:
   the power amplifier transistor and the mirror transistor each include a gate terminal, a drain terminal, and a source terminal;
   the gate terminal of the power amplifier transistor is connected to the RF signal input and a first terminal of the RF decoupling resistor; and
   the gate terminal of the mirror transistor is connected to a second terminal of the RF decoupling resistor and to the drain terminal of the mirror transistor.

4. The RF power amplifier circuit of claim 3 wherein the buffer includes a buffer transistor with a gate terminal connected to the ramp-up capacitor and a source terminal connected to the drain terminal of the mirror transistor.

5. The RF power amplifier circuit of claim 1 wherein the ramp-up switch is a transistor with a gate terminal connected to a start ramp signal input, and a drain terminal connected to the auxiliary current source.

6. The RF power amplifier circuit of claim 1 wherein the control circuit further includes a ramp-down switch connected to the ramp-up capacitor that is selectively activated at an end of the RF signal burst to discharge the ramp-up capacitor, the ramp-up switch being deactivated at the end of the RF signal burst.

7. The RF power amplifier circuit of claim 6 wherein the ramp-down switch is a transistor with a gate terminal connected to a stop ramp signal input, and a drain terminal connected to the input of the buffer and the ramp-up capacitor.

8. The RF power amplifier circuit of claim 1 wherein the input of the buffer is directly connected to the ramp-up capacitor.

9. The RF power amplifier circuit of claim 1 further comprising:
   a capacitor discharge resistor connected to the ramp-up capacitor; and
   an inverter including an input connected to the ramp-up capacitor and an output connected to the buffer, voltage at the input of the inverter exponentially decaying in a duration less than a minimum RF signal burst duration.

10. The RF power amplifier circuit of claim 9 wherein values of the ramp-up capacitor and the capacitor discharge resistor correspond to a specific exponential decay of the voltage at the input of the inverter.

11. An RF power amplifier biasing circuit with a start ramp signal input, a main current source input, an auxiliary current source input, and a circuit output, the RF power amplifier biasing circuit comprising:
   a ramp-up capacitor connected to the auxiliary current source input;
   a ramp-up switch transistor connected to the start ramp signal input, the ramp-up switch transistor being selectively activated thereby to connect the auxiliary current source input to the ramp-up capacitor;
   a buffer stage with an input connected to the ramp-up capacitor and an output connected to the main current source input at a sum node; and
   a mirror transistor with a gate terminal corresponding to the circuit output and a drain terminal connected to the sum node and to the gate terminal.

12. The RF power amplifier biasing circuit of claim 11 further comprising an RF signal decoupling resistor connected to the gate terminal of the mirror transistor.

13. The RF power amplifier biasing circuit of claim 11 wherein the buffer stage includes a buffer transistor with a gate terminal connected to the ramp-up capacitor and a source terminal connected to the sum node.

14. The RF power amplifier biasing circuit of claim 11 further comprising a ramp-down switch transistor with a gate terminal connected to a stop ramp signal input and a drain terminal connected to the ramp-up capacitor.

15. The RF power amplifier biasing circuit of claim 11 further comprising:
   an inverter stage with an input connected to the ramp-up capacitor and an output connected to the input of the buffer stage; and
   a capacitor discharge resistor connected to the ramp-up capacitor.

16. The RF power amplifier biasing circuit of claim 11 wherein the ramp-up switch transistor is selectively activated by a pulse signal on the start ramp signal input.

17. The RF power amplifier circuit of claim 11 wherein the buffer stage includes a buffer transistor with a gate terminal connected to the ramp-up capacitor and a source terminal connected to the drain terminal of the mirror transistor.

18. The RF power amplifier circuit of claim 11 further comprising a ramp-down switch connected to the ramp-up capacitor that is selectively activated at an end of the RF signal burst to discharge the ramp-up capacitor, the ramp-up switch being deactivated at the end of the RF signal burst.

19. The RF power amplifier circuit of claim 18 wherein the ramp-down switch is a transistor with a gate terminal connected to a stop ramp signal input, and a drain terminal connected to the input of the buffer stage and the ramp-up capacitor.

20. The RF power amplifier circuit of claim 15 wherein values of the ramp-up capacitor and the capacitor discharge resistor correspond to a specific exponential decay of the voltage at the input of the inverter stage.

21. An RF power amplifier biasing circuit with a biasing output and connectable to a band gap reference circuit with a first current output generating a first voltage level and a second current output generating a second voltage level, the circuit comprising:
  a switch having a first throw terminal connected to the first current output of the band gap reference circuit, a second throw terminal connected to the second current output of the band gap reference circuit, and a pole terminal, the switch selectively connecting the first throw terminal and the second throw terminal to the pole terminal in response to a switch enable input;
  an operational amplifier with a first differential input, a second differential input, and an operational amplifier output, the operational amplifier being powered by the band gap reference circuit;
  a ramping resistor-capacitor network connected to the first differential input of the operational amplifier, a ramping resistor of the ramping resistor-capacitor network being connected to the pole terminal of the switch;
  an output transistor connected to the output of the operational amplifier and having an output defining the biasing output; and
  a feedback resistor network connected to the output transistor and to the second differential input of the operational amplifier;
  wherein a voltage on the biasing output ramps from the first voltage level to the second voltage level in conjunction with the switch being selectively activated from connecting the first throw terminal and the pole terminal, to connecting the second throw terminal and the pole terminal.

22. The RF power amplifier biasing circuit of claim 21 wherein the ramping resistor-capacitor network defines a time constant for ramping the voltage on the biasing output from the first voltage level to the second voltage level.

23. The RF power amplifier biasing circuit of claim 21 wherein the output transistor is a PMOS type defined by a gate, a source, and a drain, the gate being connected to the output of the operational amplifier, the source being connected to the band gap reference circuit, and the drain being connected to the biasing output and the feedback resistor network.

24. The RF power amplifier biasing circuit of claim 21 wherein the feedback resistor network is a voltage divider circuit including a first resistor and a second resistor.

25. The RF power amplifier biasing circuit of claim 24 wherein:
  the first resistor is connected to the output transistor and the second differential input of the operational amplifier; and
  the second resistor is connected to the first resistor and the second differential input of the operational amplifier.

26. The RF power amplifier biasing circuit of claim 21 wherein the first voltage level on the first current output of the band gap reference circuit and the second voltage level on the second current output of the band gap reference circuit are adjustable in response to measured ambient temperature.

* * * * *